United States Patent [19]
Hochido et al.

[11] Patent Number: 5,932,281
[45] Date of Patent: *Aug. 3, 1999

[54] METHOD OF MANUFACTURING BI-LAYERED FERROELECTRIC THIN FILM

[75] Inventors: Yukoh Hochido, deceased, late of Tokyo, by Youko Hochido, executor; Hidekimi Kadokura, Tokyo; Masamichi Matsumoto, Saitama, all of Japan; Koji Arita, Colorado Springs, Colo.; Masamichi Azuma, Shiga; Tatsuo Otsuki, Fukui, both of Japan

[73] Assignees: Matsushita Electronics Corporation, Osaka; Kojundo Chemical Laboratory Co., Ltd., Saitama, both of Japan; Symetrix Corporation, Colorado Springs, Colo.

[*] Notice: This patent issued on a continued prosecution application filed under 37 CFR 1.53(d), and is subject to the twenty year patent term provisions of 35 U.S.C. 154(a)(2).

[21] Appl. No.: 08/854,173

[22] Filed: May 9, 1997

[30] Foreign Application Priority Data

May 14, 1996 [JP] Japan ................................ 8-119350
May 16, 1996 [JP] Japan ................................ 8-122014

[51] Int. Cl.⁶ .............................. B05D 5/12; B05D 3/12; C23C 16/00
[52] U.S. Cl. .................. 427/126.3; 427/240; 427/248.1; 427/376.2
[58] Field of Search ................... 427/126.3, 240, 427/248.1, 376.2

[56] References Cited

U.S. PATENT DOCUMENTS

| | | | |
|---|---|---|---|
| 5,453,404 | 9/1995 | Kirlin et al. | 534/15 |
| 5,527,567 | 6/1996 | Desu et al. | 427/573 |
| 5,612,082 | 3/1997 | Azuma et al. | 427/96 |
| 5,688,565 | 11/1997 | McMillan et al. | 427/565 |

OTHER PUBLICATIONS

R. Papiernik, et al., "Synthesis, Characterization and Reactivity of Lead(II) Alkoxides and Oxoalkoxides: Condensation to Oxoalkoxides as a General Structural Feature", *Polyhedron*, vol. 14, pp. 1657–1662.

Y. Shimada, et al., "Integration Technology of Ferroelectrics and the Performance of the Integrated Ferroelectrics", *Integrated Ferroelectrics*, vol. 11, pp. 229–245.

Eiji Fujii, et al., "Ferroelectric Memory Technology", *National Technical Report*, vol. 41, No. 6, pp. 692–698.

Peter C. Van Buskirk, et al., "Metalorganic Chemical Vapor Deposition of Complex Metal Oxide Thin Films by Liquid Source Chemical Vapor Deposition", *Jpn. J. Appl. Phys.*, vol. 35, pp. 2520–2525.

Mikio Yamamuka, et al., "Reaction Mechanism and Electrical Properties of (Ba, Sr)TiO₃ Films Prepared by Liquid Source Chemical Vapor Deposition", *Jpn. J. Appl. Phys.*, vol. 35, pp. 2530–2535.

*Primary Examiner*—Shrive Beck
*Assistant Examiner*—Michael Barr
*Attorney, Agent, or Firm*—Merchant, Gould, Smith, Edell, Welter & Schmidt, P.A.

[57] ABSTRACT

A method of forming a Bi-layered ferroelectric thin film on a substrate with good reproducibility, using a mixed composition of a Bi-containing organic compound and a metal polyalkoxide compound by at least one technique selected from the group consisting of molecular deposition such as CVD, and spincoat-sintering.

25 Claims, 8 Drawing Sheets

METHOD OF MANUFACTURING BI-LAYERED FERROELECTRIC THIN FILM

FIELD OF THE INVENTION

This invention relates to a method of manufacturing a Bi (bismuth)-layered ferroelectric thin film. This invention specifically relates to a method of forming with good reproducibility a Bi-layered ferroelectric thin film of a desired composition.

BACKGROUND OF THE INVENTION

Recently, techniques for forming capacitance elements comprising ferroelectric films having spontaneous polarization on a semiconductor integrated circuit has been eagerly developed in order to realize nonvolatile RAM (random access memory) which enables low operating voltage, high-speed writing and reading compared to conventional RAMs. In this trend, a group of materials called Bi-layered ferroelectric are developed to be used for such a capacitance insulating film. One of the problems of conventional ferroelectric nonvolatile memories is property deterioration of the ferroelectric film caused by repeated polarization inversion when $SrNi_2Ta_2O_9$, one of the Bi-layered ferroelectric is used. A Bi-layered ferroelectric is a substance having a crystal structure where relatively rough-filled $(Bi_2O_2)^{2+}$ layers and pseudoperovskite layers are laminated by turns. The pseudoperovskite layers comprise at least one kind of metal element and oxygen, and they have one or more relatively close-filled virtual perovskite lattices.

Well-known techniques for forming ferroelectric films are, for example, MOD (metal organic deposition), CVD (chemical vapor deposition), and sputtering. Another well-known method for forming a ferroelectric film comprises the following steps: dissolving a metalorganic compound in an organic solvent; coating the solution on a substrate by spincoating; drying the coating and sintering the coating under oxygen atmosphere.

Metalorganic compounds are usually used for forming Bi-layered ferroelectric thin films. Conventionally, however, metalorganic compounds containing the metal elements are used for the respective Bi-layered ferroelectrics. Therefore, the number of different metalorganic compounds used for source materials are increased, and accurate control of the amounts of each metal element which should exist in the film becomes difficult. As a result, it is difficult to form a Bi-layered ferroelectric thin film comprising desired elements with good reproducibility.

When forming a ferroelectric film on a semiconductor integrated circuit, superior step-coating property and processing at a low temperature are required. CVD technique is considered excellent from this viewpoint. When a ferroelectric thin film is formed by CVD technique, the metalorganic compound should be vaporized (gasified) to be fed to the substrate surface. When the metalorganic compound is gasified to be fed to a film-forming chamber, namely, when the metalorganic compound is heated to the vapor pressure required for film-forming, the compound should be prevented from being pyrolyzed or reacting with other substances in the temperature region. On the other hand, the compound should be pyrolyzed rapidly and homogeneously once it reaches the surface of the substrate. The metalorganic compounds which are conventionally used for the Bi-layered ferroelectric (except for Bi itself) do not meet the above requirements, and thus, it is difficult to form thin films of desirable compositions with good reproducibility by using CVD technique.

SUMMARY OF THE INVENTION

In order to resolve these and other problems of the conventional techniques, this invention provides a method of forming a Bi-layered ferroelectric thin film of desirable compositions with good reproducibility.

In order to achieve the above-mentioned purposes, this invention provides a method of forming a Bi- (bismuth) layered ferroelectric thin film on a substrate, in which a mixture of a Bi-containing organic compound and a metal polyalkoxide compound are used for the source material, and at least one technique selected from the group consisting of molecular deposition technique and spincoat-sintering technique is used. In this invention, a polyalkoxide compound is a compound in which one molecule comprises plural alkoxy groups.

It is preferable in the technique that the formed Bi-layered ferroelectric thin film is represented by the following Formula 1:

Formula 1

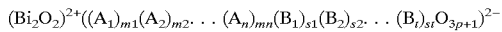

In the formula, $A_1, A_2, \ldots, A_n$ is a cationic element and also at least one simple substance or a mixture selected from the group consisting of Ba, Bi, Sr, Pb, La, and Ca. $B_1, B_2, \ldots, B_t$ is a cationic element and at least one simple substance or a mixture selected from the group consisting of Ti, Zr, Ta, Mo, W, and Nb. "p" is an integer from 1 to 5. "$m_1, m_2, \ldots, m_n$" is a non-negative real number which meets the equation of m1+m2+ . . . +mn=p−1, and "s1,s2, . . . , st" is a non-negative real number which meets the equation of s1+s2+ . . . +st=p.

It is preferable in the technique that the metal polyalkoxide compound is represented by the following Formula 2:

Formula 2

In this formula, $A_i$ is a cationic element and at least one simple substance or a mixture selected from the group consisting of Ba, Bi, Sr, Pb, La, and Ca. $B_j$ and $B_k$ are cationic elements which are identical or different from each other, and also simple substances or mixtures selected from the group consisting of Ti, Zr, Ta, Mo, W, and Nb. $R_{j1}, R_{j2}, \ldots, R_{k1}, R_{k2}, \ldots R_{j6}, R_{k6}$ is an alkyl group having carbons from 1 to 12.

The metal alkoxide compound represented by Formula 2 contains two or three kinds of metal elements, and thus, a Bi-layered ferroelectric can be formed from the metal alkoxide compound and a Bi-containing organic compound. As a result, number of the metalorganic compounds used for the source material can be reduced compared to the case of a conventional technique. Therefore, amount of the source materials (to be used) can be controlled more easily, and a Bi-layered ferroelectric thin film having a desired composition can be formed with good reproducibility.

It is preferable that the molecular deposition technique is chemical vapor deposition (CVD). It is specifically preferable that a Bi-layered ferroelectric thin film represented by Formula 1 is formed on a substrate by CVD technique, and the source material of the film is Bi-containing organic compound and the metal alkoxide compound represented by Formula 2.

It is preferable that the source material composition comprises 1 to 99 weight % of the Bi-containing organic compound and 99 to 1 weight % of the metal polyalkoxide compound.

It is preferable that each $R_{j1}, R_{j2}, \ldots R_{j6}, R_{k1}, R_{k2}, \ldots R_{k6}$ of the metal alkoxide compound represented by Formula 2 is at least one group selected from the group consisting of an ethyl group and an isopropyl group. If the respective twelve alkoxy groups of the metal alkoxide compounds comprise ethoxy or propoxy groups are used, vapor pressure sufficient for film-forming by CVD technique can be obtained in a comparatively low temperature region (at most 250° C.). As a result, amount of the compound supplied onto the substrate can be controlled more easily, and the amount of the metal elements contained in the ferroelectric thin film (excepting Bi) can be controlled more accurately.

It is preferable that $A_i$ of the alkoxide group represented by the Formula 2 is Sr or Ba, $B_j$ is Nb or Ta, and $B_k$ is Nb or Ta, so that the obtained Bi-layered ferroelectric thin film has excellent characteristics as a capacitance insulating film for a nonvolatile memory.

It is preferable that Bi tertiary butoxide or Bi tertiary pentoxide is used as the Bi-containing organic compound. As Bi tertiary butoxide and Bi tertiary pentoxide will sublimate and have high vapor pressure in a low temperature region (0.3 Torr or more at 100° C.), amount of the compound supplied to the substrate surface can be controlled more easily, and the amount of Bi contained in the ferroelectric thin film can be controlled more accurately.

It is preferable that a solution is prepared by dissolving the Bi-containing organic compound and a metal alkoxide compound represented by Formula 2 in an organic solvent, and that the solution is vaporized to supply its gas to the substrate surface in order to grow the Bi-layered ferroelectric thin film represented by Formula 1. The concentration of the Bi-containing organic compound and that of the metal alkoxide compound represented by Formula 2 in the solution are controlled to obtain a desirable Bi-layered ferroelectric composition, and as a result, a Bi-layered ferroelectric thin film having desired composition can be provided more easily.

It is preferable that ultraviolet rays are irradiated to the pyrolitic atmosphere of the source material gas, so that the decomposition of the source material gas is accelerated and the film can grow at a lower temperature. In addition, the excited state of the gas can be varied, and the orientation and the quality of the dielectric film can be controlled.

It is preferable that the source material gas is plasma-excited when the gas is pyrolyzed on the substrate, so that the decomposition of the gas is accelerated and the film can grow at a lower temperature. In addition, the excited state of the gas can be varied, and the orientation and the quality of the dielectric film can be controlled.

It is preferable that the Bi-layered ferroelectric thin film represented by Formula 1 is formed by forming a coating of a solution on the substrate, and by drying and sintering the coating under an oxygen atmosphere. The solution is obtained by dissolving a Bi-containing organic compound and a metal alkoxide compound represented by Formula 2 in an organic solvent. Accordingly, the controlled concentration of the Bi-contained organic compound and that of the metal alkoxide compound reflect the composition of the Bi-layered ferroelectric composition. Therefore, the desirable ferroelectric thin layer composition can be provided with good reproducibility.

It is preferable that the organic solvent contains tetrahydrofuran. This material is well dissolved in the Bi-containing organic compound and in the metallic alkoxide compound represented by Formula 2, so that the compounds can be homogeneously dissolved in the solution, and as a result, more homogeneous Bi-layered ferroelectric composition can be provided.

It is also possible in the spincoat-sintering technique that a solution prepared by dissolving the Bi-containing solution and the metal alkoxide compound represented by Formula 1, and then the solution is coated on the substrate and the coating is dried to be sintered under an oxygen atmosphere.

When a Pb-containing Bi-layered ferroelectric thin film is produced by CVD technique, a qualified thin film can be grown at a low temperature if an alkoxide compound called a double alkoxide is used for the metalorganic gas. The gas contains at least one element selected from the group consisting of Sr (strontium) and Ba (barium), and at least one element selected from the group consisting of Nb (niobium) and Ta(tantalum). In other words, this invention provides a method for producing a Pb-containing Bi-layered ferroelectric thin film (Formula 3) from a Bi-containing organic compound, a Pb-containing organic compound, and an alkoxide compound represented by Formula 4.

Formula 3

$(Sr_aBa_bPb_c)(Nb_xTa_y)Bi_2O_9$ where $a+b+c=1$, $0<c<1$, $x+y=2$.

Formula 4

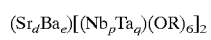

$(Sr_dBa_e)[(Nb_pTa_q)(OR)_6]_2$ where $d+e=1$, $p+q=1$, R is $C_2H_5$ or $CH(CH_3)_2$.

In this way, the alkoxide compound (double alkoxide) represented by Formula 4 remains stable not being decomposed when it is vaporized or sublimed to be supplied into the film-forming chamber of a CVD device, and it is decomposed rapidly and homogeneously on the heated substrate in the film-forming chamber (300 to 500° C). Therefore, the Bi-layered ferroelectric thin film represented by Formula 3 can grow stably. It is generally required that the plural kinds of the organic metals (gases) as source materials are decomposed and deposited substantially simultaneously so that the thin film comprising plural elements will grow on the substrate by CVD technique to have a desired element ratio. In this method, the element ratio of the film can easily be controlled since the three kinds of organic metal gasses are decomposed substantially simultaneously in the temperature region of from 300 to 500° C. The three organic metals means Bi-containing compound, Pb-containing compound, and the alkoxide compound (double alxokide) represented by Formula 4.

It is preferable that the amount of the added Pb-containing organic compound ranges from $1 \times 10^{-5}$ to 200 weight parts when the mixed composition comprising the Bi-containing organic compound and the metal polyalkoxide compound is 100 weight parts.

It is preferable that the Pb-containing organic compound is at least one compound selected from the group consisting of Pb tertiary butoxide and Pb oxotertiary butoxide.

It is preferable that the Bi-containing organic compound is at least one compound selected from the group consisting of Bi tertiary butoxide and Bi tertiary pentoxide.

It is preferable that the CVD technique is the optical CVD technique to irradiate ultraviolet rays to the pyrolitic atmosphere of the source material gas.

It is preferable that the CVD method is the plasma CVD method to plasma-excite the source material gas at the time of pyrolyzing the gas.

It is preferable that the substrate is a semiconductor. In the invention, it is possible to combine Bi-layered ferroelectric thin film forming steps in the process of producing the semiconductor device, and semiconductor devices such as a nonvolatile memory can be produced efficiently.

It is preferable that the Bi-layered ferroelectric thin film is from 1 nm to 10 $\mu$m thick.

DETAILED DESCRIPTION OF THE INVENTION

Figure 1:
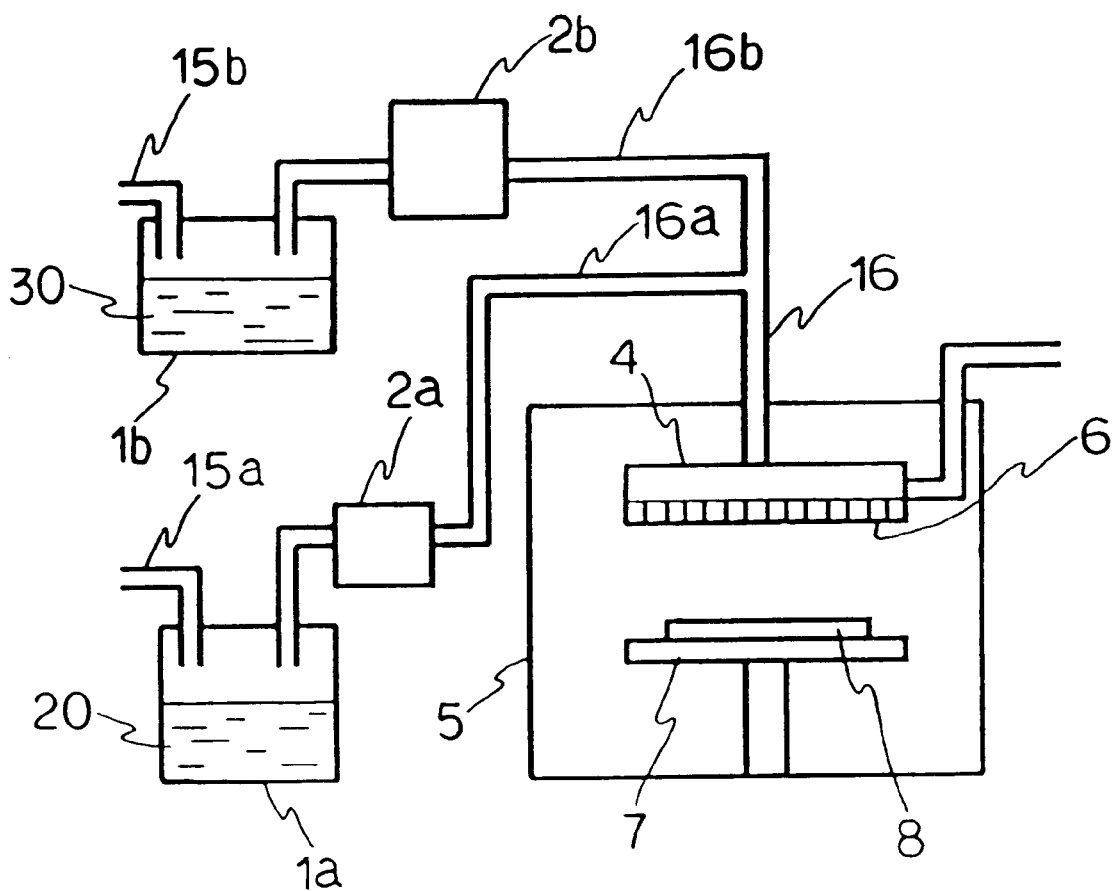
FIG. 1 is a schematic diagram of a first CVD device used for forming a Bi-layered ferroelectric thin film of this invention.

As mentioned above, in the method of forming a Bi-layered ferroelectric thin film of this invention, the source material was the mixture of a Bi-containing compound and a metal alkoxide compound. As a result, the number of metalorganic compounds needed as the source material can be reduced, and the amount for material supply (use amount) can be easily controlled compared to conventional techniques. Therefore, a Bi-layered ferroelectric thin film comprising a desired element composition is produced with good reproducibility.

The metal alkoxide compound is stable, namely, it is not pyrolyzed or reacted with other substances under a vapor pressure required for film forming by CVD technique. When the Bi-layered ferroelectric film of metal alkoxide compound and the Bi-containing organic compound is formed on the substrate by the CVD technique, the source material gasses (Bi-containing organic compound gas and metal alkoxide compound gas) supplied to the substrate surface reflects the element composition of the Bi-layered ferroelectric, and thus, a Bi-layered ferroelectric thin film of desirable composition can be formed with extremely good reproducibility.

In this invention, the metal alkoxide compound represented by Formula 2 and Bi-containing organic compound are dissolved in an organic solvent to obtain a solution, and the solution is coated on a substrate. After that, the solution is dried and sintered under an oxygen atmosphere in order to form a Bi-layered ferroelectric thin film. As a result, the concentration of the metal alkoxide compound and the Bi-containing organic compound will directly reflect the composition of the Bi-layered ferroelectric, and thus, a Bi-layered ferroelectric thin film of a desirable composition can be formed with extremely good reproducibility.

In addition, predetermined alkoxide compounds are used in this invention, so that a Pb-containing Bi-layered ferroelectric thin film can grow to have desirable composition and crystal structure by the CVD technique. As a result, it is possible to combine Bi-layered ferroelectric thin film forming steps in the process of producing a semiconductor device, and semiconductor devices such as a nonvolatile memory is produced efficiently.

Metal alkoxide compounds are used in this invention, because of the following advantages: such a metal alkoxide compound can be easily synthesized, separated and refined, and provides high vapor pressure at a relatively low temperature (at most 250° C.). Another advantage of the compound is that it does not pyrolyze or react with other elements. In addition to these advantages, the compound enables precise control of the existing ratio of the metal elements in the dielectric film since the molecular structure limits the composition ratio of the metal elements excepting Bi. Examples of such metal elements ($A_i$) in the metal alkoxide compound are Ia group elements including Sr and Ba, Ia group elements including Na and K, and Pb. Examples of the metal elements ($B_j$, $B_k$) are Fe, Ti, W, and Va group elements including Nb and Ta. The obtained Bi-layered ferroelectric thin film will be provided with excellent properties (spontaneous polarization property) as a capacitance insulating film for a nonvolatile memory especially when the metal elements ($A_i$) are IIa group elements including Sr and Ta, and the metal elements ($B_j$, $B_k$) are Va group elements including Nb and Ta. The alkyl groups of the alkoxy groups ($OR_{j1}$, $OR_{j2}$... $OR_{j6}$, $OR_{k1}$, $OR_{k2}$, ... $OR_{k6}$ in Formula 4) contained in the metal alkoxide compound are typically alkyl groups having carbons from 1 to 5, more specifically, methyl groups, ethyl groups, isopropyl groups, tertiary butyl groups, and isopentyl groups are included. The six alkyl groups that coordinate with the metal elements ($B_j$, $B_k$) can be one kind, differentiated from each other, or can be classified to from two to five kinds of groups. Especially when the alkyl groups in the compound (alkyl groups which coordinate with the metal element ($B_j$) and alkyl groups which coordinate with the metal element ($B_k$)) are either ethyl groups or isopropyl groups, vapor pressure sufficient for film-forming will be provided by CVD technique when the metal alkoxide compound is in a relatively low temperature region (at most 250° C.).

It is preferred because the amount of metal elements (excepting Bi) can be controlled more precisely when the Bi-layered ferroelectric thin film grows by CVD technique. The following compounds are taken as preferable examples for the metal alkoxide compounds suited for CVD technique.

(1) $Sr[Ta(OiPr)_6]_2$
(2) $Sr[Nb(OiPr)_6]_2$
(3) $Ba[Ta(OiPr)_6]_2$
(4) $Ba[Nb(OiPr)_6]_2$
(5) $Sr[Ta(OiPr)_6][Nb(OiPr)_6]$
(6) $Ba[Ta(OiPr)_6][Nb(OiPr)_6]$
(7) $Sr[Ta(OiPr)_3(OEt)_3]_2$
(8) $Sr[Ta(OiPr)_3(OEt)_3][Ta(OiPr)_2(OEt)_4]$ (9) $Sr[Ta(OEt)_6]_2$
(10) $Sr[Ta(OiPr)_6]_2$
(11) $Sr[Nb(OEt)_6]_2$
(12) $Sr[Nb(OiPr)_6]_2$
(13) $Ba[Ta(OEt)_6]_2$
(14) $Ba[Ta(OiPr)_6]_2$
(15) $Ba[Nb(OEt)_6]_2$
(16) $Ba[Nb(OiPr)_6]_2$

In these examples, Et indicates an ethyl group and iPr indicates an isopropyl group. In this invention, one or plural kinds of metal alkoxide compounds can be used. These metal alkoxide compounds can be easily synthesized, separated and refined. They vaporize or sublimate in a relatively low temperature region (130 to 230° C.) to provide a vapor pressure (at least 0.01 Torr) required to be supplied into the film-forming chamber of a CVD device. In addition, the compounds are stable and are not decomposed while they are supplied into the film-forming chamber of the CVD device, and then rapidly pyrolyzed on the substrate which is heated to 300 to 500° C.

Organic compounds containing Bi (bismuth) include triphenyl bismuth, Bi tertiary butoxide, and Bi-tertiary pentoxide, one or plural kinds of them can be used. Among them, Bi-tertiary butoxide and Bi tertiary pentoxide will sublimate and have high vapor pressure in a low temperature region (at least 0.3 Torr at 100° C.). Therefore, supply amount to the substrate can be controlled accurately when the Bi-layered ferroelectric thin film grows by CVD technique. In addition, as Bi tertiary butoxide and Bi tertiary pentoxide have alkoxy groups as the functional groups like the alkoxide compound represented by Formula 4, merely react with the alkoxide compounds in the transport way to the reaction chamber, and their pyrolitic temperature are low as that of the alkoxide compound. More specifically, the pyrolitic temperature of Bi tertiary butoxide and Bi tertiary pentoxide is from 250 to 400° C. while that of the alkoxide compound is from 300 to 500° C. Triphenyl bismuth is not preferable in view of film composition control since its pyrolitic temperature ranges from 500 to 700° C., which is higher than that of the alkoxide compound by more than 200° C.

In this invention, the above-mentioned metal alkoxide compound and Bi-containing organic compound are used. With these compounds, it is possible to use the metal alkoxide compound which contains some metals other than Bi, and another organic compound. In this case, the metals contained in the organic compounds correspond to any one metal element selected from the group consisting of $A_1, A_2, \ldots A_n, B_1, B_2, \ldots B_t$ in the Bi-layered ferroelectric thin film (Formula 3) produced in this invention. When an organic compound containing Pb is used, remnant polarization value of the Bi-layered ferroelectric thin film can be increased. The Pb-containing organic compounds include $PbMe_4$, $PbEt_4$, $PbEt_3(OCH_2CMe_3)$, $PbEt_3(OiPr)$, $PbEt_3(OtBu)$, $Pb(dpm)_2$, $Pb(tmhpd)_2$, $Pb(OtBu)_2$, and $Pb_4O(OtBu)_6$. Here, Me indicates a methyl group, Et is an ethyl group, iPr is an isopropyl group, tBu is a tertiary butyl group, dpm is a dipivaloymethanate, and tmhpd is 2,2,6-trimethylheptane-3,5-dionate. The first to fifth organic compounds having Pb to which alkyl groups are directly coupled have acute toxicity. The subsequent two compounds comprising β-diketonate can react with the metal alkoxide compounds in the transport way to the reaction chamber before they assist the growth of the Bi-layered ferroelectric thin film by CVD technique. As a result, it is preferable that at least one of the latter two compounds, namely, Pb tertiary butoxide and Pb oxotertiary butoxide is used when a Bi-layered ferroelectric thin film is formed by CVD technique. Pb tertiary butoxide is the most volatile compound among the Pb alkoxides and it sublimates at 100° C. under vacuum in order to partially pyrolyze during the sublimate and to change into Pb oxotertiary butoxide ($Pb_4O(OtBu)_6$). Pb oxotertiary butoxide is more preferable for the CVD material since it is more stable to heat and sublimates under vacuum at 130° C. or a higher temperature. The Pb oxotertiary butoxide can be synthesized in the way described in Polyhedron vol.14 1657 (1991) by R. Papiernik, L. G. Hubert-Pfalzgraf and M. C. Massiani.

In some cases, the predetermined metal elements (e.g., Sr, Ta, and Nb) supplied by the metal alkoxide compound represented by Formula 2 are not sufficient to provide a desired film-forming composition, namely, the metal alkoxide compound cannot provide sufficient amount of metal elements to be contained in the film. In such a case, the metal alkoxide compound represented by Formula 2 should be used with another alkoxide containing one of the metal elements of the metal alkoxide compound, e.g., Sr alkoxide, Ta alkoxide and Nb alkoxide. In this case, it is preferable that the alkoxy groups of the alkoxide are identical to those of the metal alkoxide compound represented by Formula 2.

In this invention, Bi-layered ferroelectric thin film is formed from the metalorganic compounds comprising at least the metal alkoxide compound represented by Formula 2 and the Bi-containing organic compound. Some well-known film-forming methods, such as MOD, CVD, and sputtering exemplified in the conventional techniques, can be used. As mentioned above, CVD technique is preferred to form a film on a semiconductor integrated circuit (semiconductor substrate). The following operation is preferred: preparing a uniform solution by dissolving a metalorganic compound in an organic solvent; coating the solution on a substrate by a well-known film-forming methods such as spincoating; drying the coating; and sintering the coating under an oxygen pressure.

The well-known CVD techniques used in this invention include normal pressure CVD, vacuum CVD, optical CVD, and plasma CVD. Normal pressure CVD means that the source compounds are pyrolyzed and deposited on the substrate under atmospheric pressure. In vacuum CVD, the same operation is carried out in a reduced pressure. In optical CVD, ultraviolet rays are irradiated to the pyrolitic atmosphere of the source material gas in order to accelerate the growth reaction. In plasma CVD, the source material gas is plasma-excited to accelerate the growth reaction when the source material gas is pyrolyzed. In this invention, the source materials (the metal alkoxide compound represented by Formula 2, Bi-containing organic compound and Pb-containing organic compound) are liquid or solid state at a room temperature, and they are usually gasified by heat when they are formed to a film by CVD technique. In the gasification process, it is usual to gasify each compound by forming masses of respective compounds (that is, containing every source material in a predetermined container). In this process, it is preferable to dissolve all the source material compounds in a single organic solvent and to gasify the uniform solution. According to this way, a Bi-layered ferroelectric thin film of a desired composition can grow by controlling the respective source material compounds to be desired concentrations during the preparation of the solution, since the concentration ratio of the source material compounds in the solution directly reflects the weight ratio of the gasified compounds. As a result, the film composition can easily be controlled compared to a case where a Bi-layered ferroelectric thin film is formed by gasifying each compound and controlling the supply of the respective gasses into the reaction chamber. The organic solvents used to unifying the source compounds include hydrocarbons, nitroparaffins, organic sulfur compounds, alcohols, phenols, aldehydes, ethers, ketones, organic acids, amines, and esters. Such solvents can be used alone or as a mixture thereof. For the organic solvent, tetrahydrofuran can be used alone or a mixture with at least one of the above-exemplified solvents in order to obtain a uniform solution since the source material compounds dissolve well in tetrahydrofuran, and thus, composition homogeneity of the Bi-layered ferroelectric thin film is improved.

The above-mentioned solution in which the source material compounds are uniformly dissolved can be directly applied to another film-forming method where the coating on the substrate is dried and sintered.

Conventional Pb-containing organic compounds which are generally used in this field (film-forming by CVD) can be used in this invention. The examples are: $PbMe_4$, $PbEt_4$, $PbEt_3(OCH_2CMe_3)$, $PbEt_3(OiPr)$, $PbEt_3(OtBu)$, $Pb(dpm)_2$, $Pb(tmhpd)_2$, $Pb(OtBu)_2$, and $Pb_4O(OtBu)_6$. Here, Me indicates a methyl group, Et is an ethyl group, iPr is an isopropyl group, tBu is a tertiary butyl group, dpm is a dipivaloymethanate, and tmhpd is 2,2,6-trimethylheptane-3, 5-dionate. At least one of these compounds is used. The first to fifth organic compounds having Pb to which alkyl groups are directly coupled have acute toxicity. The subsequent two compounds comprising β-diketonate can react with the alkoxide compounds (Formula 4) in the transport way to the reaction chamber before they assist the growth of the Bi-layered ferroelectric thin film by CVD technique. As a result, it is preferable that at least one of the latter two compounds, namely, Pb tertiary butoxide and Pb oxotertiary butoxide are used. Pb tertiary butoxide is the most volatile compound among the Pb alkoxides and it sublimates at 100° C. under vacuum in order to partially pyrolyze during the sublimate and to change into Pb oxotertiary butoxide ($Pb_4O(OtBu)_6$). Pb oxotertiary butoxide is more preferable for the CVD material since it is more stable to heat and sublimates under vacuum at 130° C. or a higher temperature. In addition, as Pb oxotertiary butoxide has alkoxy groups as the functional groups like the alkoxide compound represented by Formula 4, merely react with the alkoxide compounds in the transport way to the reaction chamber, and their pyrolitic temperatures are similar to that of the alkoxide compound, namely, ranges from 300 to 500° C. Therefore, the film composition can easily be controlled. The Pb oxotertiary butoxide can be synthesized in the way described in *Polyhedron* vol.14 1657 (1991) by R. Papiernik, L. G. Hubert-Pfalzgraf and M. C. Massiani. In the method, Pb oxotertiary butoxide is obtained by reacting lead acetate ($Pb(OAc)_2$: Ac is an acetyl group) and sodium tertiary butoxide (NaOtBu) with each other in tetrahydrofuran (THF), removing the solvent, and sublimating the solid at 200° C. in vacuum.

In some cases, desirable film composition (desirable Ta-containing ratio or Nb-containing ratio) cannot be obtained only by Ta or Nb supplied by the alkoxide compound represented by Formula 4, namely, supply is insufficient. In such a case, additional Ta alkoxide or Nb alkoxide can be applied plus the alkoxide compound represented by Formula 4. In this case, it is preferable that the Ta alkoxide or the Nb alkoxide has alkoxy groups identical to those of the alkoxide compound represented by Formula 4.

In this invention, well-known CVD techniques including normal pressure CVD, vacuum CVD, optical CVD, and plasma CVD, can be used. In vacuum CVD technique, ferroelectric thin films grow in vacuum of at most 50 Torr.

FIG. 1 is a schematic diagram to show a first embodiment of a CVD device used for forming a Bi-layered ferroelectric thin film. In FIG. 1, 1a and 1b are containers (masses of source materials) to contain metal alkoxide compounds 20 and Bi-containing organic compound 30 represented by Formula 2 or 4, which are heated to a predetermined temperature by a heater (not shown). Carrier gas comprising inert gasses such as nitrogen and argon is supplied from outside to the container through pipes (15a, 15b). The containers (1a, 1b) are heated to vaporize (gasify) the metal alkoxide compound 20 and the Bi-containing organic compound 30, since the compounds are usually liquid or solid states in a room temperature. The gasified compounds (20, 30) in the containers (1a, 1b) are respectively controlled by flow controllers (2a, 2b), supplied with the carrier gas to a mixer 4, mixed in the mixer 4 with oxygen as an oxidant, and uniformly supplied on a semiconductor wafer (substrate) 8 heated by a heater 7 from a shower nozzle 6 in a film-forming chamber 5. The compounds (20, 30) supplied on the wafer 8 are pyrolyzed and deposited, and grow to be a Bi-layered ferroelectric thin film. During the step, inside the film-forming chamber 5 is maintained to be normal pressure or evacuated. Although the source material compounds are supplied from two supply systems (container 1a, 1b and pipes 16a, 16b), supply systems comprising containers and pipes will be added corresponding to the additional source materials when any metalorganic compounds other than the compounds represented by Formulas 2 and 4 are used.

Figure 2:
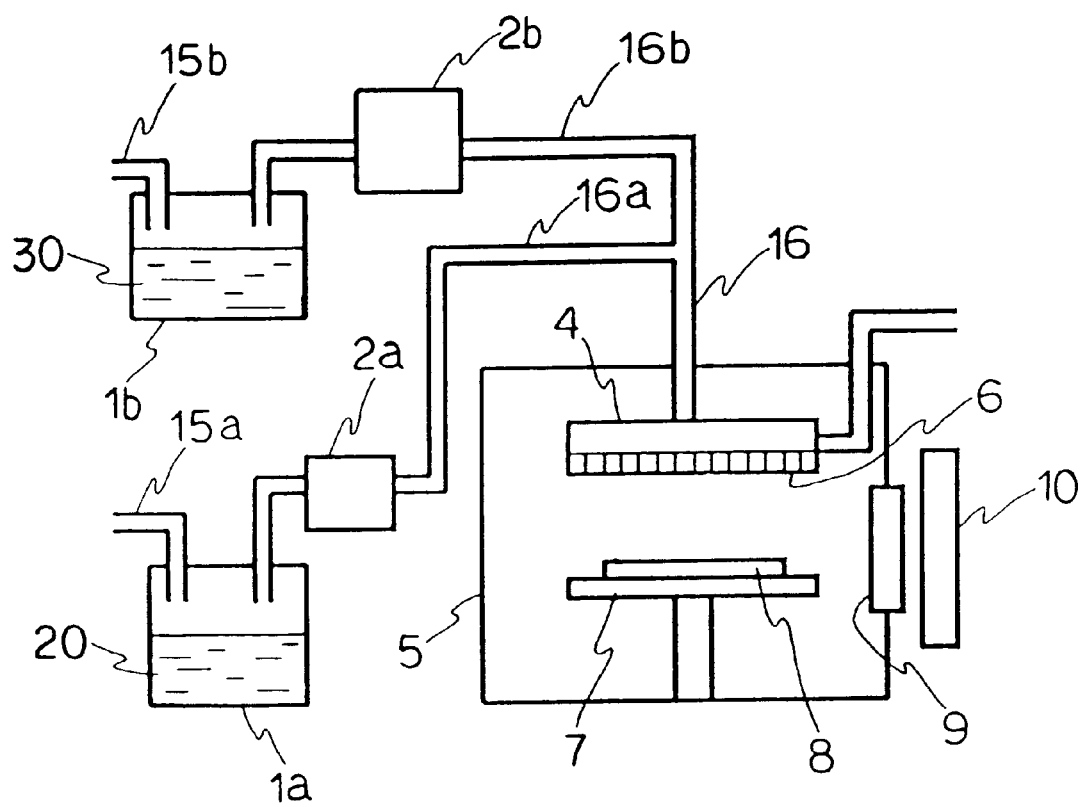
FIG. 2 is a schematic diagram of a second CVD device used for forming a Bi-layered ferroelectric thin film of this invention.

FIG. 2 is a schematic diagram of a second embodiment of a CVD device used for forming a Bi-layered ferroelectric thin film of this invention. In FIG. 2, numerals corresponding to those of FIG. 1 indicate the identical or corresponding portions, 9 is a window and 10 is an ultraviolet light source. The device is the same as that of FIG. 1 except that ultraviolet rays are irradiated in the film-forming chamber 5 through the window 9 from the ultraviolet light source 10. In this device, while the source material compound and oxygen are applied to the surface of the wafer 8, ultraviolet rays are irradiated thereon. As a result, decomposition of the source material is accelerated and the film can grow at a lower temperature. In addition, the excited states of the source material compounds can be varied and active substances different from those of the normal pyrolysis can be formed, and thus, orientation and film properties of the dielectric film can be controlled. The exciting source is not limited to the ultraviolet rays used in this invention; similar effects can be obtained if the window 9 and the ultraviolet light source 10 are replaced by a plasma-generator.

Figure 3:
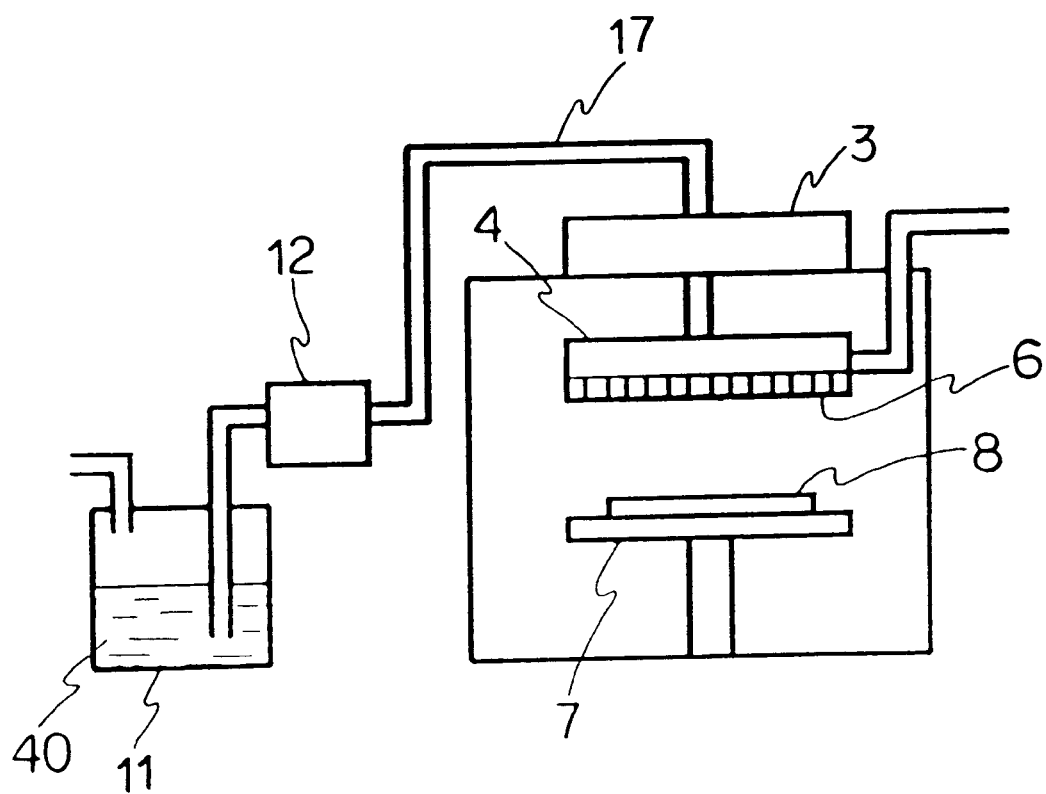
FIG. 3 is a schematic diagram of a third CVD device used for forming a Bi-layered ferroelectric thin film of this invention.

FIG. 3 is a schematic diagram of a third embodiment of a CVD device used for forming a Bi-layered ferroelectric thin film. In FIG. 3, numerals corresponding to those of FIG. 1 indicate the identical or corresponding portions. Numeral 11 is a container in which a solution 40 is fed. The solution 40 is obtained by dissolving the metal alkoxide compound and the Bi-containing organic compound represented by Formula 2 and 4 in the organic solvent. The solution 40 is flow-controlled by the flow controller 12, and supplied through a pipe 17 to a vaporizer 3 with carrier gas comprising inert gasses such as nitrogen or argon supplied from outside by another pipe (not shown). After the solution 40 is vaporized in the vaporizer 3, the source material gas obtained due to this vaporization is mixed with oxygen as an oxidant in the mixer 4, then the mixed gas is supplied to the surface of the wafer 8 heated by the heater 7 from the shower nozzle 6, so that a Bi-layered ferroelectric thin film is formed. During this process, inside of the film-forming chamber 5 is kept in normal pressure or evacuated.

The device is constituted to supply the gas of the solution and the oxygen to the wafer 8 after the gasses are mixed in the mixer 4. It is also possible that the gas of the solution and the oxygen are respectively supplied to the wafer 8 through respective routes. It is also possible to provide an ultraviolet rays irradiating means or a plasma generator as in the device in FIG. 2.

Although oxygen is used as an oxidant gas in the above-mentioned CVD devices, other materials such as ozone can also be used.

Figure 4:
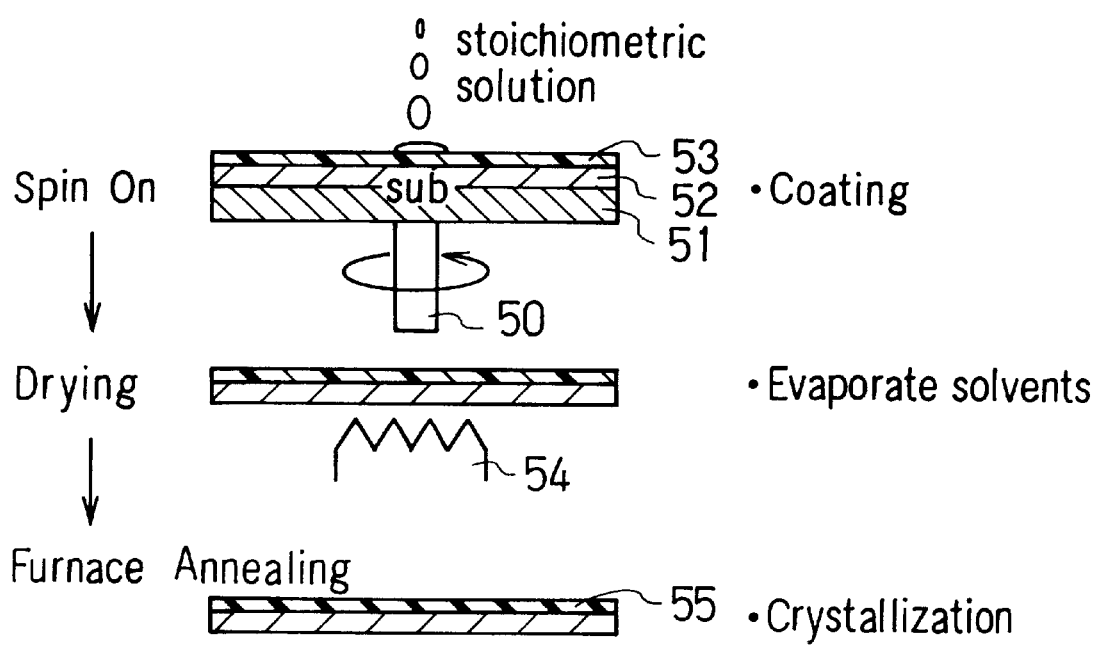
FIG. 4 is a schematic flow of a spincoat-sintering technique of one embodiment of this invention.

FIG. 4 is a schematic flow to show spincoat-sintering technique of one embodiment of this invention. In FIG. 4, a semiconductor substrate 52 is fixed on a disc base 51 connected to a rotation axis 50, a coating solution is dropped from above, and the disc base 51 is rotated so that the film thickness of the final product will be 150 to 200 nm. The coating solution is obtained by dissolving a compound containing the metal alkoxide compound of Formula 2 in an organic solvent such as tetrahydrofuran. In the next step, the solvent is removed by drying at 260° C. for three minutes, and printing (sintering) is conducted at 800° C. for 60 minutes for crystallization. As a result, a Bi-layered ferroelectric thin film having a desired thickness of from 150 to 200 nm can be produced.

Figure 5:
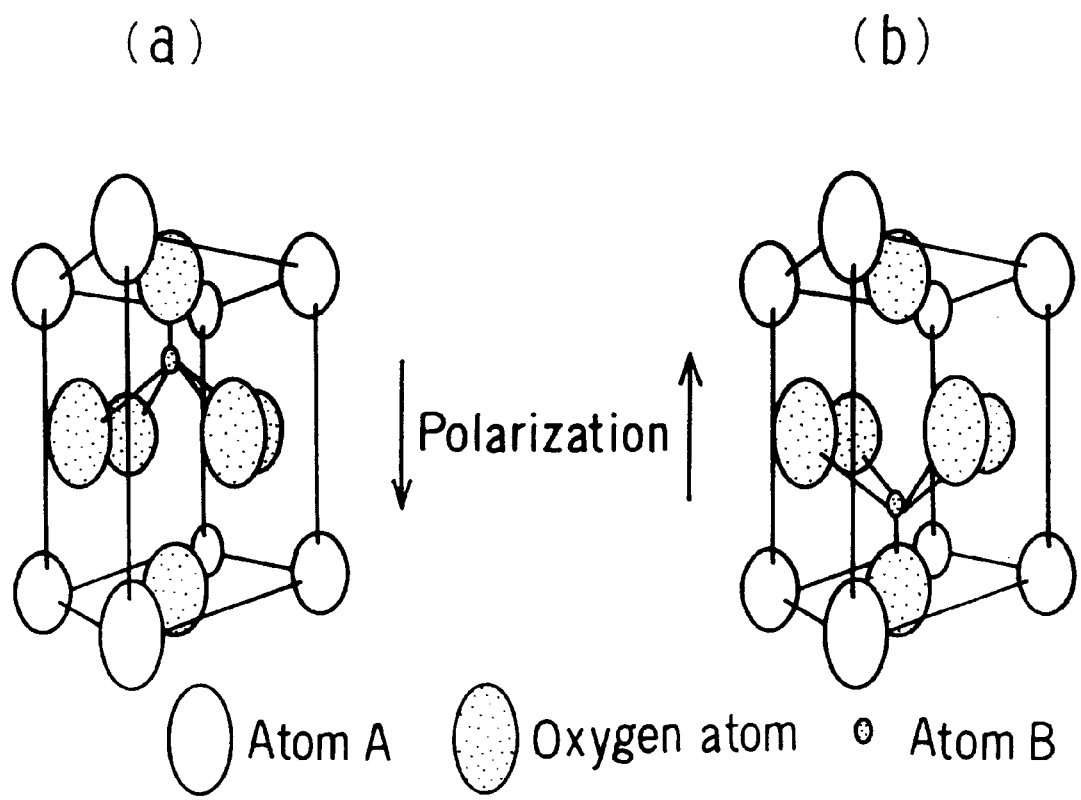
FIG. 5a is a schematic illustration of crystal structure of one embodiment of this invention where the Bi-layered thin film is ferroelectric and atom B is positioned at the upper part of the structure.
In FIG. 5b, the same atom B is positioned at the lower part of the structure.
Figure 6:
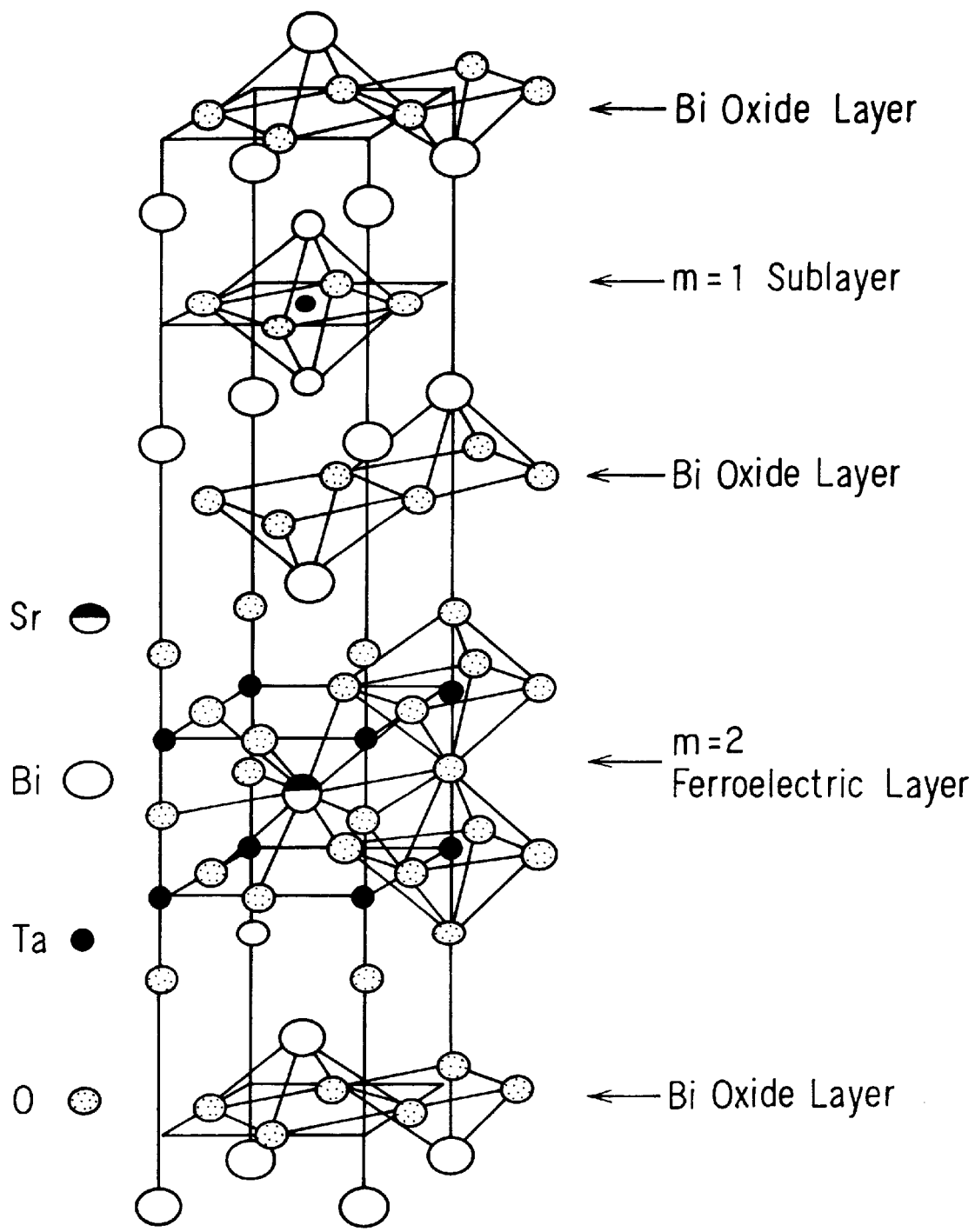
FIG. 6 is a schematic illustration of $ABO_3$ pseudoperovskite crystal structure of one embodiment of this invention where the Bi atoms exist therein.

FIGS. 5a and 5b are schematic illustrations of crystal structure where the Bi-layered thin film of one embodiment of this invention is ferroelectric. When the atom at the middle of the crystal lattice is shifted to upper or lower part due to the electric field direction, it will deviate from electric neutrality and polarized. In FIGS. 5a and 5b, the atom A may be Sn, and the atom B may be Ta or Nb. Bi atoms exist as a $Bi_2O_3$ layer between the $ABO_3$ pseudoperovskite structure crystals as shown in FIG. 6.

Figure 7:
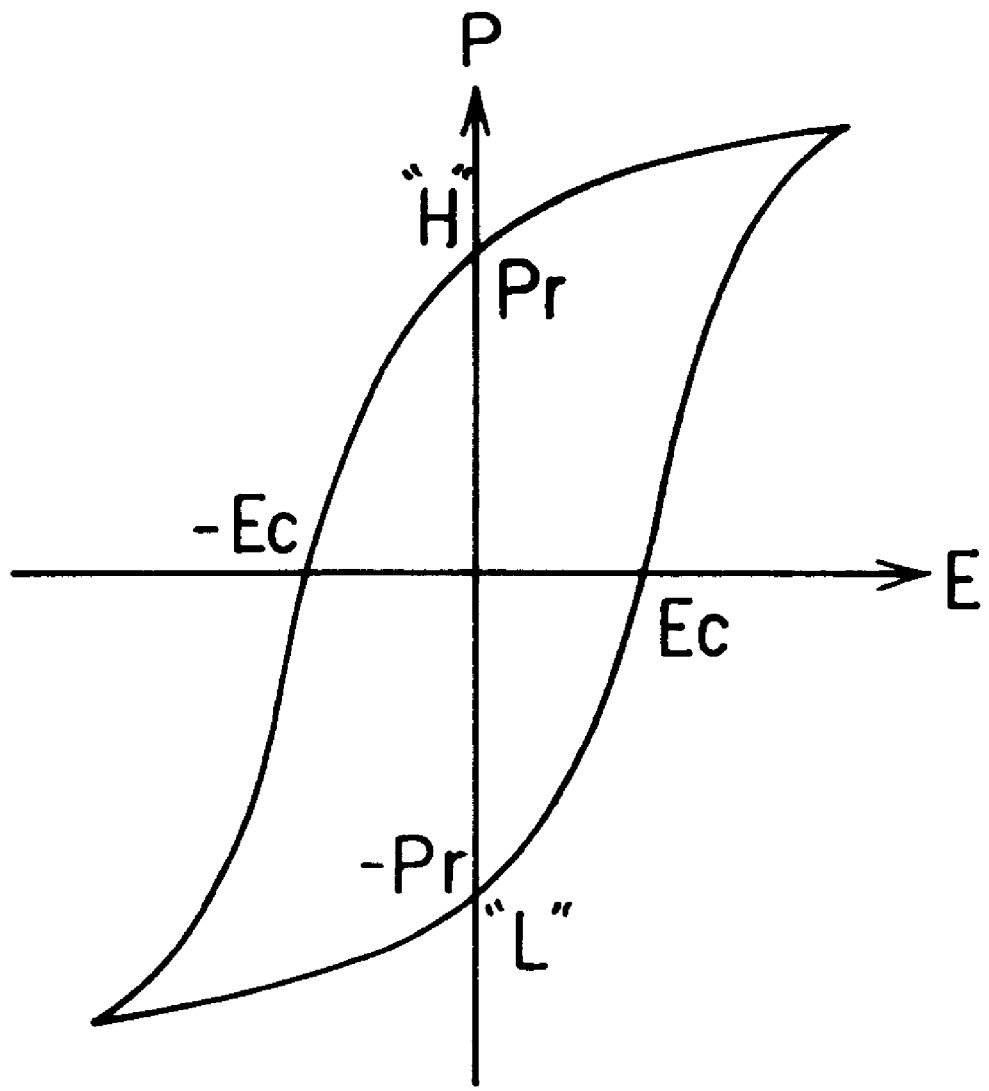
FIG. 7 is a graph of a hysteresis curve of one embodiment of this invention as a function of the applied electric field to the polarization concentration of the Bi-layered thin film.

As a result, a hysteresis curve as a function of the applied electric field E to the polarization concentration P appears as shown in FIG. 7. As remnant polarization of two values remains even if the applied electric field is zero, the two states are applied to the memory states of "L" and "H", and thus, nonvolatile memory operation is provided. As the states of "L" and "H" indicate switching at atomic level, writing at a high speed at a low voltage is realized.

Examples according to this invention are explained below, though they do not intend to limit this invention.

EXAMPLE 1

Tantalum ethoxide $(Ta(OC_2H_5)_5)$ (50.4 g) and 200 cc of ethanol were put in a flask with capacitor, 5.6 g of metal strontium was added, and heating reflux was conducted for about 11 hours. After the reflux, ethanol was removed and the product was dried in vacuum. The dried product was melted at about 130° C. as it was being heated and distilled under reduced pressure. A colorless-transparent liquid was recovered as a main fraction of distillate at temperatures from 165 to 170° C. This liquid was air-cooled and solidified, and it weighed 42.0 g. Analyses on elements and on organic groups showed that this crystal was $Sr[Ta(OC_2H_5)_6]_2$.

Figure 8:
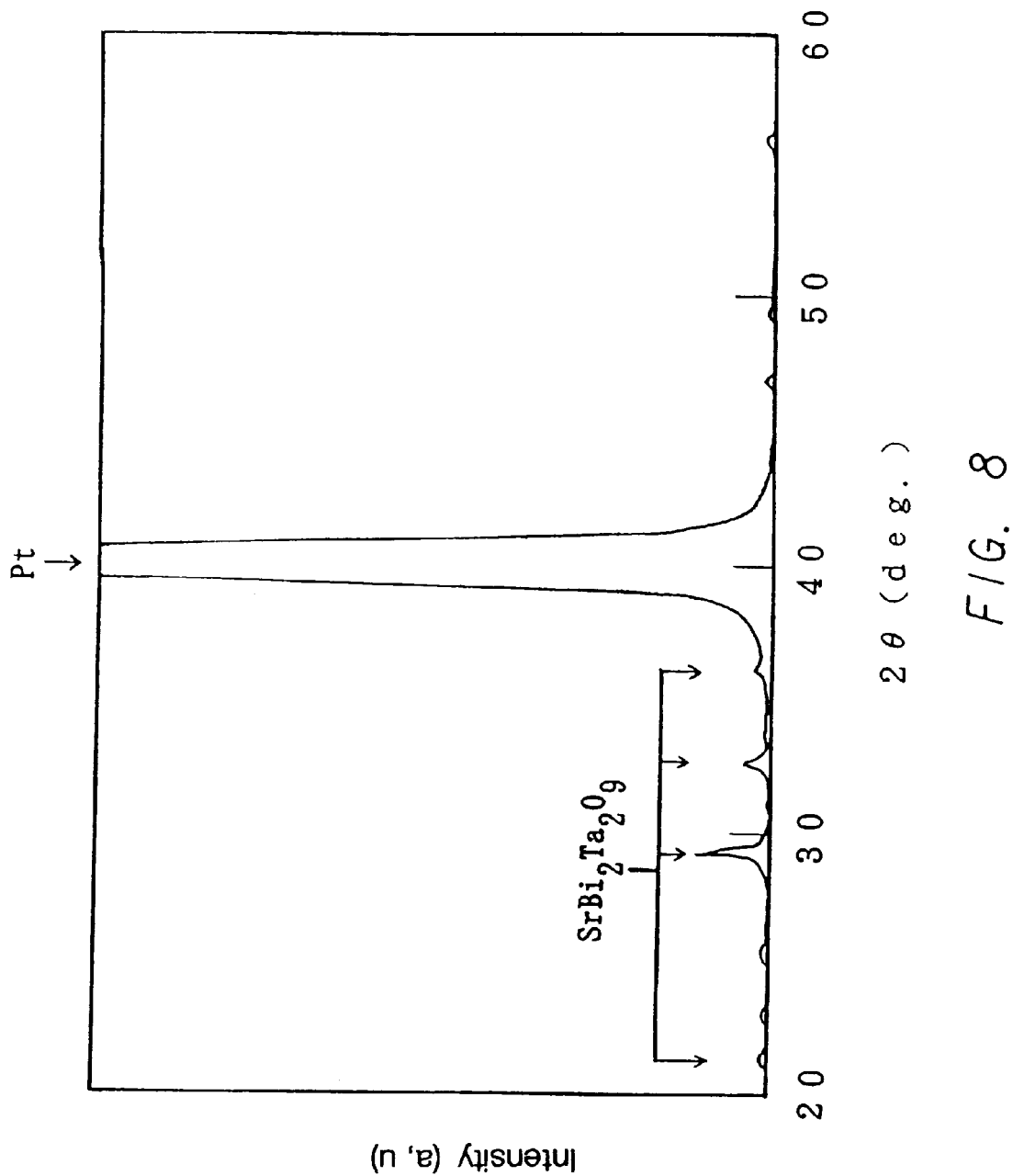
FIG. 8 is a spectral atlas by the XRD of the Bi-layered ferroelectric thin films obtained in Examples 1 and 5.

Next, a ferroelectric thin film was formed in the following process by using the obtained materials. The CVD device in FIG. 1 was used. The inside of the film-forming chamber 5 was evacuated to 0.3 Torr. In the container 1a, $Sr[Ta(OC_2H_5)_6]_2$ was sealed while $Bi(OC(CH_3)_2C_2H_5)_3$ was sealed in the container 1b. The $Sr[Ta(OC_2H_5)_6]_2$ supply system including the container 1a and the pipe 16a was maintained to be 150° C., while the $Bi(OC(CH_3)_2C_2H_5)_3$ supply system including the container 1b and the pipe 16b was maintained to be 80° C. The vapors (gasses) of $Sr[Ta(OC_2H_5)_6]_2$ and $Bi(OC(CH_3)_2C_2H_5)_3$ were introduced inside the film-forming chamber 5 by flowing $N_2$ carrier gas in each supply system. At the same time, oxygen gas was introduced inside the film-forming chamber 5 in order to pyrolyze the two gasses on the Si wafer having Pt film formed thereon in the film-forming chamber 5, and decomposed substance was deposited on the Si wafer. In addition, ultraviolet rays were irradiated to the pyrolitic atmosphere of the gas. Next, the thin film formed on the wafer was crystallized by putting this Si wafer in an oxygen atmospheric furnace. According to a measurement by an X-ray diffraction (XRD), the thin film composition was $SiBi_2Ta_2O_9$, which was a Bi-layered ferroelectric thin film having a desired composition. FIG. 8 is a spectral graph by the XRD, where some peaks due to $SiBi_2Ta_2O_9$ having Bi-layer structure can be seen in addition to the Pt peaks.

EXAMPLE 2

A single solution was prepared by dissolving 49.5 g of $Sr[Ta(OC_2H_5)_6]_2$ and 42.2 g of $Bi(OC(CH_3)_2C_2H_5)_3$ in 1000 cc of tetrahydrofuran. In the next step, this solution was sealed in a container 11 of the CVD device shown in FIG. 3, and supplied to the vaporizer 3 with $N_2$ carrier gas. The solution gasified in the vaporizer 3 was mixed with oxygen (oxidant) in the mixer 4, and supplied to an Si wafer surface heated by a heater from the shower nozzle 4 in the film-forming chamber 5 in order to pyrolyze the two gasses and to deposit the decomposed substance on the Si wafer. The Si wafer was previously provided with Pt film on the surface. The thin film formed on the surface was crystallized by putting the Si wafer in the oxygen atmospheric furnace. Measurement by the XRD showed that the film composition was $SrBi_2Ta_2O_9$ and the film was a Bi-layered ferroelectric.

EXAMPLE 3

In this Example, a CVD device shown in FIG. 1 was used, except that two source material supply systems were further added. Source materials were sealed respectively in the containers (a–d) and the temperatures of source supply systems were respectively maintained (see Table 1).

TABLE 1

| Containers | Sealed materials | Temperatures |
| --- | --- | --- |
| Container a | $Sr[Ta(OC_2H_5)_6]_2$ | 150° C. |
| Container b | $Ta(OC_2H_5)_5$ | 100° C. |
| Container c | $Pb_4O(OtBu)_6$ | 170° C. |
| Container d | $Bi(OC(CH_3)_2C_2H_5)_3$ | 80° C. |

(Note: OtBu in Table 1 indicates a tertiary butoxide group.)

While keeping the supply systems to be their respective predetermined temperatures, vapors (gasses) of the materials were introduced into the film-forming chamber 5 from the containers (a–d) by flowing $N_2$ carrier gas in each container. At the same time, oxygen gas was introduced in order to pyrolyze the two gasses on the Si wafer on which Pt film was previously formed in the film-forming chamber 5 which was evacuated to 0.3 Torr, and thus, the decomposed substance was deposited on the Si wafer. After that, the thin film formed on the Si wafer was crystallized by putting the Si wafer in an oxygen atmospheric furnace. XRD measurement and element analysis showed that the film composition was $(Sr_{0.8}Pb_{0.2})Bi_2Ta_2O_9$. Its crystal structure was similar to that of a typical Bi-layered ferroelectric, or $SrBi_2Ta_2O_9$.

EXAMPLE 4

A single solution for dielectric film-forming was prepared by dissolving 57.9 g of $Sr[Ta(OC_3H_7)_6]_2$ and 47.0 g of Bi(OC(CH$_3$)$_2$C$_2$H$_5$)$_3$ in 1000 cc of toluene. The solution was coated on a Si wafer (on which Pt film was previously formed) by spincoating. This Si wafer was put in an oxygen atmospheric furnace in order to crystallize the deposited film. XRD measurement showed that the obtained film composition was SrBi$_2$Ta$_2$O$_9$, and the film was a Bi-layered ferroelectric.

EXAMPLE 5

Source material compounds (respectively 25 g) shown in the following Table 2 were filled in the containers from (1) to (4) of the vacuum CVD device having a reaction chamber (pyrolitic furnace) of 5 Torr, and each container was kept to be a predetermined temperature. Argon was introduced to each container and fed to the pyrolitic furnace with the vapors of the source material compounds which were sublimated or vaporized.

TABLE 2

| Container No. | Filled compounds | Container temperature | Argon flow |
|---|---|---|---|
| Container(1) | Sr[Ta(OEt)$_6$]$_2$ | 150° C. | 30 ml/min |
| Container(2) | Ta(OEt)$_6$ | 100° C. | 20 ml/min |
| Container(3) | Pb$_4$O(OtBu)$_6$ | 170° C. | 30 ml/min |
| Container(4) | Bi(OtBu)$_3$ | 80° C. | 30 ml/min |

(Note: OEt in Table 2 indicates an ethoxy group and OtBu indicates a tertiary butoxy group.)

In the pyrolitic furnace, a Pt/SiO$_2$/Si substrate was heated to 350° C. The above four gasses were introduced onto the substrate surface, pyrolyzed and deposited. Next, a mixed gas of oxygen and argon was flown in the pyrolitic furnace, temperature inside the furnace was raised to 750° C. to conduct crystallization for 60 minutes. As a result, a 200 nm thick film grew on the Pt/SiO$_2$/Si substrate. The crystal structure of this film was analyzed by X-ray diffraction (XRD), which showed the film was identical to that of a typical Bi-layered ferroelectric (SrBi$_2$Ta$_2$O$_9$). In the XRD spectral graph shown in FIG. 8, some peaks due to SrBi$_2$Ta$_2$O$_9$ having Bi-layered structure are seen in addition to the Pt peak. This film was partially wet decomposed. This wet decomposition was conducted by measuring precisely about 0.1 g of the coating solution in a polytetrafluoroethylene beaker, adding 10 ml (68 wt %) of pure nitric acid and 0.1 ml (46.5 wt %) of hydrofluoric acid for semiconductor, heating until the solution became transparent, allowing the solution to cool down, and measuring 100 ml of the solution in a volumeric flask. The substance of this solution was element-analyzed by ICP (inductively coupled plasma) emission analysis. The film composition was (Sr$_{0.8}$Pb$_{0.2}$)Bi$_{2.0}$Ta$_{2.0}$O$_{9.0}$.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A method of producing a layered ferroelectric thin film containing bismuth on a substrate, comprising the steps of:
   mixing a Bi-containing organic compound and a metal alkoxide compound that comprises at least two different kinds of metal atoms; and
   forming a layered ferroelectric thin film containing bismuth on the substrate by a process including deposition of the mixture onto the substrate.

2. The method of claim 1, wherein said deposition is selected from the group consisting of molecular deposition, spincoat-sintering, and chemical vapor deposition.

3. The method of claim 1, wherein the formed Bi-layered ferroelectric thin film is described by the following Formula 1:

Formula 1

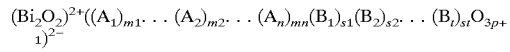

where each of A$_1$, A$_2$, . . . , A$_n$ is at least one selected from the group consisting of Ba, Bi, Sr, Pb, La, and Ca; each of B$_1$, B$_2$, . . . , B$_t$ is at least one selected from the group consisting of Ti, Zr, Ta, Mo, W, and Nb; p is an integer from 1 to 5; m1+m2+ . . . +mn=p−1; and s1+s2+ . . . st=p.

4. The method of claim 1, wherein the metal alkoxide compound is described by the following Formula 2:

Formula 2

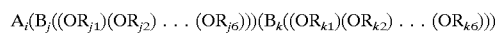

where A$_i$ is at least selected from the group consisting of Ba, Bi, Sr, Pb, La, and Ca; Bj and Bk are identical or different from each other, and are at least one selected from the group consisting of Ti, Zr, Ta, Mo, W, and Nb; and each of R$_{j1}$, R$_{j2}$, . . . , R$_{j6}$, R$_{k1}$, R$_{k2}$, . . . R$_{k6}$ is an alkyl group having from 1 to 12 carbons.

5. The method of claim 1, wherein the deposition comprises chemical vapor deposition.

6. The method of claim 1, wherein the mixture comprises 1 to 99 weight % of the Bi-containing organic compound and 99 to 1 weight % of the metal alkoxide compound.

7. The method of claim 4, wherein each metal alkoxide compound of R$_{j1}$, R$_{j2}$, . . . R$_{j6}$, R$_{k1}$, R$_{k2}$, . . . R$_{k6}$ represented by Formula 2 comprises at least one of an ethyl group or an isopropyl group.

8. The method of claim 4, wherein A$_i$ of Formula 2 comprises at least one element selected from the group consisting of Sr and Ba; B$_j$ comprises at least one element selected from the group consisting of Nb and Ta; and B$_k$ comprises at least one element selected from the group consisting of Nb and Ta.

9. The method of claim 1, wherein the Bi-containing organic compound comprises at least one compound selected from the group consisting of Bi tertiary butoxide and Bi tertiary pentoxide.

10. The method of claim 5, wherein the chemical vapor deposition comprises dissolving the Bi-containing organic compound and the metal alkoxide compound in an organic solvent to form a solution; vaporizing the solution to form a gas; and applying the gas on the substrate.

11. The method of claim 10, wherein the organic solvent comprises tetrahydrofuran.

12. The method of claim 10, wherein the chemical vapor deposition comprises optical chemical vapor deposition to irradiate ultraviolet rays to the pyrolitic atmosphere of the source material gas.

13. The method of claim 10, wherein the chemical vapor deposition comprises plasma chemical vapor deposition to plasma-excite the gas when the gas is pyrolyzed.

14. The method of claim 2, wherein the spincoat-sintering comprises:

dissolving the Bi-containing organic compound and the metal alkoxide compound in an organic solvent to form a solution;

coating the solution on the substrate and drying the coating; and sintering the coating under an oxygen atmosphere.

15. The method of claim 14, wherein the organic solvent comprises tetrahydrofuran.

16. The method of claim 1, wherein an organic compound containing Pb is further added to the mixture.

17. The method of claim 16, wherein the amount of the Pb-containing organic compound is from $1 \times 10^{-5}$ to 200 parts by weight when the mixed composition comprising Bi-containing organic compound and the metal polyalkoxide compound is 100 weight parts.

18. The method of claim 16, wherein the formed layered ferroelectric thin film is represented by the following Formula 3:

Formula 3

$$(Sr_aBa_bPb_c)(Nb_xTa_y)Bi_2O_9$$

where a+b+c=1, 0<c<1, x+y=2.

19. The method of claim 16, wherein the layered ferroelectric thin film is applied on the substrate by chemical vapor deposition, using a mixture comprising an alkoxide compound represented by the following Formula 4 and a Pb-containing organic compound, Formula 4

$$(Sr_dBa_e)[(Nb_pTa_q)(OR)_6]_2$$

where d+e=1, p+q=1, R is $C_2H_5$ or $CH(CH_3)_2$).

20. The method of claim 16, wherein the Pb-containing organic compound comprises at least one compound selected from the group consisting of Pb tertiary butoxide and Pb oxotertiary butoxide.

21. The method of claim 16, wherein the Bi-containing organic compound comprises at least one compound selected from the group consisting of Bi tertiary butoxide and Bi tertiary pentoxide.

22. The method of claim 19, wherein the chemical vapor deposition comprises optical chemical vapor deposition to irradiate ultraviolet rays to the pyrolitic atmosphere of the gas.

23. The method of claim 19, wherein the chemical vapor deposition comprises plasma chemical vapor deposition to plasma-excite the gas when the gas is pyrolyzed.

24. The method of claim 1, wherein the substrate is a semiconductor.

25. The method of claim 1, wherein the layered ferroelectric thin film is 1 nm to 10 μm thick.

* * * * *